United States Patent [19]
Honda

[11] Patent Number: 5,751,053
[45] Date of Patent: May 12, 1998

[54] SEMICONDUCTOR DEVICE HAVING A BIPOLAR TRANSISTOR AND METHOD OF MANUFACTURING THE SAME

[75] Inventor: Hiroki Honda, Hyogo, Japan

[73] Assignee: Mitsubishi Denki Kabushiki Kaisha, Tokyo, Japan

[21] Appl. No.: 870,267

[22] Filed: Jun. 9, 1997

Related U.S. Application Data

[63] Continuation of Ser. No. 397,517, Mar. 2, 1995, abandoned.

[30] Foreign Application Priority Data

Jun. 21, 1994 [JP] Japan .................................. 6-138513

[51] Int. Cl.$^6$ .................................................. H01L 27/082
[52] U.S. Cl. ........................ 257/592; 257/593; 257/577; 257/565; 257/378
[58] Field of Search ............................ 257/273, 370, 257/378, 577, 566, 592, 565, 590, 593

[56] References Cited

U.S. PATENT DOCUMENTS 5,336,926  8/1994  Matthews .............................. 257/592

FOREIGN PATENT DOCUMENTS

| | | |
|---|---|---|
| 63-88856 | 4/1988 | Japan . |
| 63-278265 | 11/1988 | Japan . |
| 1-194461 | 8/1989 | Japan . |
| 2-219262 | 8/1990 | Japan . |
| 4-226063 | 8/1992 | Japan . |

OTHER PUBLICATIONS

Paul R. Gray and Robert G. Meyer, Analysis and Design of Analog Integrated Circuits, Second Edition, Chapters 2.3–2.4.

"High Performance 1.0UM N–Well CMOS/Bipolar Technology", H. Momose et al., Symposium of VLSI Technology, Sep. 1983, pp. 40–41.

"A 1.0UM N–Well CMOS Bipolar Technology for VLSI Circuits", J. Miyamoto et al., IEDM DIgest of Technical Papers, Dec. 1983, pp. 63–66.

"High Speed BICMOS VLSI Technology With Buried Twin Well Structure", A. Watanabe et al., IEDM Digest of Technology Papers, 1985, pp. 423–426.

*Primary Examiner*—Jerome Jackson
*Assistant Examiner*—Nathan K. Kelley
*Attorney, Agent, or Firm*—McDermott, Will & Emery

[57] ABSTRACT

A bipolar transistor, an nMOS transistor and pMOS transistor are formed at a main surface of a p-type semiconductor substrate. The bipolar transistor includes a collector layer, a base layer and an emitter layer. Collector layer located immediately under base layer contains impurity of n-type at a concentration not more than $5 \times 10^{18}$ cm$^{-3}$. Base layer located immediately under emitter layer has a diffusion depth not more than 0.3 μm. A semiconductor device including the bipolar transistor having the above structure is used in a circuit performing small amplitude operation. Thereby, it is possible to provide the semiconductor device having the bipolar transistor, which can be manufactured at a low cost and can operate at a high speed.

13 Claims, 20 Drawing Sheets

SEMICONDUCTOR DEVICE HAVING A BIPOLAR TRANSISTOR AND METHOD OF MANUFACTURING THE SAME

This application is a continuation of application Ser. No. 08/397,517 filed Mar. 2, 1995, now abandoned.

BACKGROUND OF THE INVENTION

1. Field of the Invention

The present invention relates to a semiconductor device having a bipolar transistor and a method of manufacturing the same, and particularly to a semiconductor device having a bipolar transistor, which can be used in a circuit performing small amplitude operation, and a method of manufacturing the same.

2. Description of the Background Art

A BiCMOS (Bipolar Complementary Metal Oxide Semiconductor) has been known as an example of a semiconductor device having a bipolar transistor. The conventional BiCMOS will be described below with reference to FIGS. 15–24. FIG. 15 is a cross section showing a structure of the conventional BiCMOS disclosed in *SYMPOSIUM ON VLSI TECHNOLOGY DIGEST OF TECHNICAL PAPERS*, pp. 40–41, 1983.

Referring to FIG. 15, a p-type semiconductor substrate 101 is provided at its main surface with a bipolar transistor 102, an nMOS transistor 103 and a pMOS transistor 104. These form the BiCMOS.

On the main surface of p-type semiconductor substrate 101, there are formed an n-well region 105a and an n-type collector layer 105b spaced from each other. At a surface of n-well region 105a, there is formed $p^+$-diffusion layers 111 forming source/drain regions of pMOS transistor 104. A gate electrode 107a is formed on a region between $p^+$-diffusion regions 111 with a gate oxide film 108 therebetween.

On a surface of collector layer 105b, there are formed a base layer 112 of bipolar transistor 102, an external base layer 111a, an emitter layer 113 and an $n^+$-diffusion layer 109c.

At a main surface of p-type semiconductor substrate 101 between n-well region 105a and collector layer 105b, there are formed a pair of $n^-$-diffusion layers 109a between which a channel region 110 is defined and a pair of $n^+$-diffusion layers 109b forming source/drain regions of nMOS transistor 103. Channel doping was effected on channel region 110 by introducing a predetermined amount of p-type impurity. A gate electrode 107b is formed on channel region 110 with gate oxide film 108 therebetween.

An isolating oxide film 106 is selectively formed on the main surface of p-type semiconductor substrate 101. Isolating oxide film 106, bipolar transistor 102, NMOS transistor 103 and pMOS transistor 104 are covered with interlayer insulating layer 114 made of, e.g., a silicon oxide film. Interlayer insulating layer 114 is provided at predetermined positions with contact holes. Metal interconnections 115a, 115b, 115c, 115d, 115e, 115f and 115g made of material containing, e.g., aluminum are formed in the contact holes.

Referring to FIGS. 16–21, a method of manufacturing the BiCMOS shown in FIG. 15 will be described below. FIGS. 16–21 are cross sections showing 1st to 6th steps in the process of manufacturing the conventional BiCMOS shown in FIG. 15.

Referring to FIG. 16, isolating oxide film 106 is formed at element isolating regions in the main surface of p-type semiconductor substrate 101, e.g., by the LOCOS (Local Oxidation of Silicon) method. Then, a resist pattern 118 is formed on the main surface of p-type semiconductor substrate 101. Resist pattern 118 exposes regions at which PMOS transistor 104 and bipolar transistor 102 are to be formed. Using resist pattern 118 as a mask, impurity such as phosphorus (P) is implanted into the main surface of p-type semiconductor substrate 101. Thereby, n-well region 105a and collector layer 105b which have a concentration from about $10^{16}$ to about $10^{18}$cm$^{-3}$ are formed. Then, an underlying oxide layer 108a used by the above LOCOS method is removed by wet etching, and then a thermal oxidation method or the like is used to form gate oxide film 108.

Referring to FIG. 17, a resist pattern 118a is then formed to cover n-well region 105a and a collector electrode formation region. Using this resist pattern 118a as a mask, impurity of p-type such as boron (B) is implanted into the main surface of p-type semiconductor substrate 101. This is performed under the conditions of 100 keV and $3.0\times10^{12}$ cm$^{-2}$. Thereby, channel region 110 of nMOS transistor 103 and base layer 112 of bipolar transistor 102 are formed.

Referring to FIG. 18, photolithography and ion implantation technique are used to form the channel region of pMOS transistor 104, and then the CVD method or the like is used to deposit a polycrystalline silicon layer on the whole main surface of p-type semiconductor substrate 101. This polycrystalline silicon layer is patterned to form gate electrode 107a of pMOS transistor 104 and gate electrode 107b of nMOS transistor 103.

Referring to FIG. 19, one forms a resist pattern 118b exposing a region in the main surface of p-type semiconductor substrate 101 at which nMOS transistor 103 is to be formed. Using resist pattern 118b as a mask, n-type impurity such as phosphorus (P) is implanted into the main surface of p-type semiconductor substrate 101. Thereby, $n^-$-diffusion layers 109a are formed.

Referring to FIG. 20, side wall insulating layers 116 made of, e.g., silicon oxide films are formed on side walls of gate electrodes 107a and 107b. A resist pattern 118c exposing a formation region for nMOS transistor 103, a collector electrode formation region and an emitter layer formation region is formed on the main surface of p-type semiconductor substrate 101. Using resist pattern 118c as a mask, n-type impurity such as arsenic (As) is implanted into the main surface of p-type semiconductor substrate 101. Thereby, $n^+$-diffusion layers 109b and 109c and emitter layer 113 are formed.

Referring to FIG. 21, a resist pattern 118d exposing a formation region for PMOS transistor 104 and a formation region for external base layer 111a is formed on the main surface of p-type semiconductor substrate 101. Using resist pattern 118d as a mask, p-type impurity such as boron (B) is implanted into the main surface of p-type semiconductor substrate 101. Thereby, $p^+$-diffusion layers 111 and external base layer 111a are formed.

Thereafter, interlayer insulating layer 114 made of, e.g., a silicon oxide film is formed entirely on the main surface of p-type semiconductor substrate 101 by the CVD method. Then, photolithography and etching technique are used to form the contact holes at predetermined regions in interlayer insulating layer 114. A sputtering method or the like is used to form metal interconnections 115a–115g in the contact holes. Through the above steps, the BiCMOS shown in FIG. 15 is formed.

Since the conventional BiCMOS is manufactured as described above, it presents the following problem. The problem will be described below with reference to FIG. 24.

FIG. 24 is a fragmentary cross section showing, on an enlarged scale, the bipolar transistor of the conventional BiCMOS shown in FIG. 15.

Referring to FIG. 24, base layer 112 located immediately under emitter layer 113 in the conventional BiCMOS has a large diffusion depth D of about 0.35 µm. This is mainly due to the facts that (1) base layer 112 and channel region 110 of nMOS transistor 103 are simultaneously formed and that (2) nMOS transistor 103, PMOS transistor 104 and side wall insulating layers 116 are formed after formation of base layer 112. Simultaneous formation of channel region 110 and base layer 112 restricts the conditions for forming base layer 112. More specifically, base layer 112 is formed under the conditions of 100 keV and $3.0\times10^{12}$ $cm^{-2}$. Therefore, base layer 112 has the relatively large diffusion depth D. In addition thereto, pMOS transistor 104, nMOS transistor 103 and side wall insulating layers 116 are formed after formation of base layer 112. Thus, heat treatment required for forming them is effected on base layer 112. Due to the above facts, base layer 112 has the relatively large diffusion depth D of about 0.35 µm. Therefore, the high-speed operation of the bipolar transistor is impaired.

As measures for ensuring the high-speed operation of bipolar transistor, an $n^+$-buried layer of a high concentration of about $10^{19}$ $cm^{-3}$ or more may be formed in collector layer 105b. This is disclosed, for example, in *IEDM DIGEST OF TECHNICAL PAPERS*, pp. 63–66, 1983 and *IEDM DIGEST OF TECHNICAL PAPERS*, pp. 423–426, 1985.

FIG. 22 is a fragmentary cross section showing, on an enlarged scale, a bipolar transistor in a BiCMOS provided with such an $n^+$-buried layer 122. FIG. 23 shows a concentration distribution taken along line Y—Y in FIG. 22.

Referring to FIGS. 22 and 23, owing to provision of $n^+$-buried layer 122, a region containing impurity at a high concentration can be formed in collector layer 105b. Thereby, a collector resistance can be reduced. As a result, an operation speed of the bipolar transistor can be increased.

However, various steps for photolithographic processing, ion implantation and others are required for forming $n^+$-buried layer 122. Particularly, addition of the photolithographic processing significantly increases a manufacturing cost. Therefore, it has been desired to increase the operation speed of bipolar transistor without forming $n^+$-buried layer 122.

SUMMARY OF THE INVENTION

The present invention has been developed to overcome the above-noted problem. An object of the invention is to provide a semiconductor device having a bipolar transistor which can be manufactured at a low cost and can operate at an improved speed as well as a method of manufacturing the same.

A bipolar transistor according to the invention includes a semiconductor substrate of a first conductivity type having a main surface, a collector layer of a second conductivity type, a base layer of the first conductivity type, and an emitter layer of the second conductivity type. The collector layer is formed at the main surface of the semiconductor substrate. The base layer is formed at the surface of the collector layer. The emitter layer is formed at the surface of the base layer. The collector layer located immediately under the base layer contains impurity of the second conductivity type at a concentration not more than $5\times10^{18}$ $cm^{-3}$, and the base layer located immediately under the emitter layer has a diffusion depth not more than 0.3 µm.

In the bipolar transistor according to the invention, the collector layer immediately under the base layer contains the impurity of the second conductivity type at a concentration not more than $5\times10^{18}$ $cm^{-3}$. Thus, a buried layer of the second conductivity type of the high concentration is not formed in the collector layer located immediately under the base. Thereby, the collector layer has a relatively high resistance. This increases a tendency of the bipolar transistor toward saturation. The bipolar transistor described above presents a merit when used in a circuit performing small amplitude operation. However, if the base layer immediately under the emitter layer had a relatively large diffusion depth of, e.g., 0.35 µm similarly to the prior art, the high-speed operation of the bipolar transistor would be significantly impaired. Therefore, the diffusion depth of the base layer immediately under the emitter layer is set to a restricted value not more than 0.3 µm, whereby the high-speed operation of the bipolar transistor can be ensured. Thereby, the invention can provide a bipolar transistor which can be manufactured at a low manufacturing cost owing to elimination of formation of a high-concentration buried layer, can be used in a circuit performing small amplitude operation and can operate at a high speed.

A semiconductor device having a bipolar transistor according to another aspect of the invention includes a semiconductor substrate of a first conductivity type having a main surface, a collector layer of a second conductivity type, a base layer of the first conductivity type, an emitter layer of the second conductivity type, and an MOS transistor. The collector layer is formed at a first region in the main surface of the semiconductor substrate. The base layer is formed at the surface of the collector layer. The emitter layer is formed at the surface of the base layer. The MOS transistor is formed at a second region in the main surface of the semiconductor substrate. The MOS transistor has a minimum gate length not more than 0.8 µm, and the collector layer located immediately under the base layer contains impurity of the second conductivity type at a concentration not more than $5\times10^{18}$ $cm^{-3}$. The base layer located immediately under the emitter layer has a diffusion depth not more than 0.3 µm.

The semiconductor device having the bipolar transistor according to the above aspect of invention includes the MOS transistor of which minimum gate length is not more than 0.8 µm. If the MOS transistor has the minimum gate length not less than 1.0 µm, a semiconductor device having the bipolar transistor already described as the prior art deserves use in a circuit performing small amplitude operation. However, if the minimum gate length of the MOS transistor is about 0.9 µm, a delay time is not substantially improved, so that the semiconductor device having the bipolar transistor shown as the prior art does not deserve use in the circuit performing the small amplitude operation. In the case where the MOS transistor were further miniaturized to have the minimum gate length not more than 0.8 µm, the operation speed would be impaired by using the semiconductor device, which has the bipolar transistor shown as the prior art, in the circuit performing the small amplitude operation. In contrast thereto, the semiconductor device having the bipolar transistor according to the invention, since the high-speed operation of the bipolar transistor is ensured, it deserves use in the circuit performing the small amplitude operation in spite of the fact that the MOS transistor has the minimum gate length not more than 0.8 µm.

In a method of manufacturing a semiconductor device having a bipolar transistor according to the invention, a collector layer is first formed by introducing impurity of a second conductivity type into a first region of a main surface of a semiconductor substrate of a first conductivity type. A gate electrode of an MOS transistor is formed at a second region in the main surface of the semiconductor substrate. Then, impurity of the second conductivity type is selectively introduced into the second region to form source/drain regions of the MOS transistor. After forming the source/drain regions, impurity of the first conductivity type is implanted into the surface of the collector layer to form a base layer.

In the method of manufacturing the semiconductor device having the bipolar transistor according to the invention, implantation of the impurity for forming a channel region of the MOS transistor and implantation of the impurity for forming the base layer are performed at different steps, in contrast to the prior art performing them at the same time. Therefore, implantation of the impurity for forming the base layer can be performed without taking the conditions for forming the channel region of the MOS transistor into consideration. Therefore, an implantation energy of the impurity for forming the base layer can be small. As a result, the diffusion depth of the base layer can be small.

Further, the base layer is formed after forming the source/drain regions of the MOS transistor. In the prior art, the base layer is formed prior to formation of the source/drain regions of the MOS transistor. Therefore, heat treatment for forming them is effected also on the base layer. This increases the diffusion depth of the base layer. Meanwhile, according to the invention, the base layer is formed after forming the source/drain regions of the MOS transistor as described above, so that the heat treatment for forming them is not effected on the base layer. Therefore, the diffusion depth of the base layer can be small. For the above reasons, the invention can provide the semiconductor device having the bipolar transistor of which operation speed is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device having a bipolar transistor according to the invention will be described below with reference to FIGS. 1 to 14. In the following description, a BiCMOS is discussed as an example of the semiconductor device having the bipolar transistor.

Figure 1:
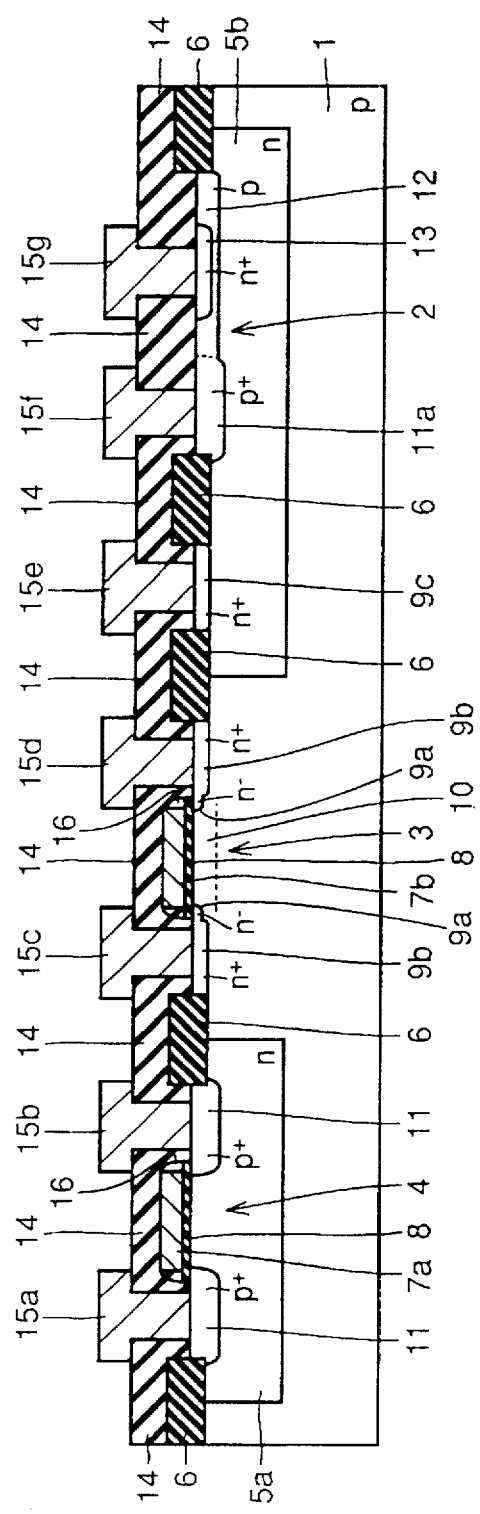
FIG. 1 is a cross section showing a BiCMOS of an embodiment of the invention.
Figure 15:
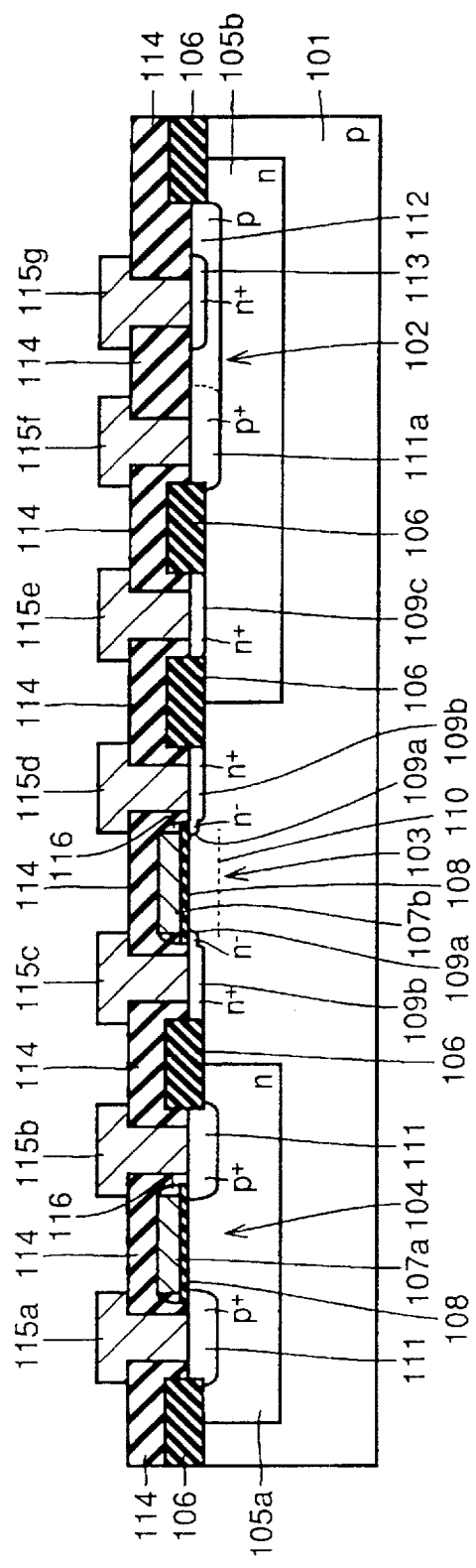
FIG. 15 is a cross section showing a conventional BiCMOS.
Figure 16:
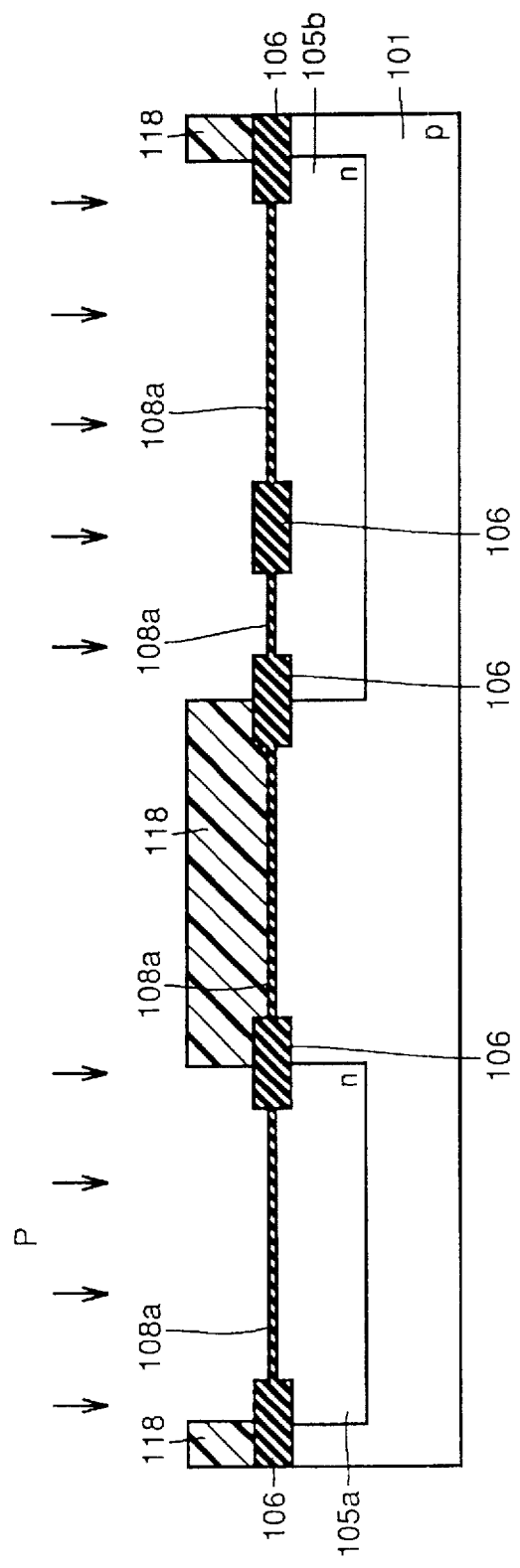
FIGS. 16–21 are cross sections showing 1st to 6th steps in a process of manufacturing the BiCMOS shown in FIG. 15, respectively.
Figure 17:
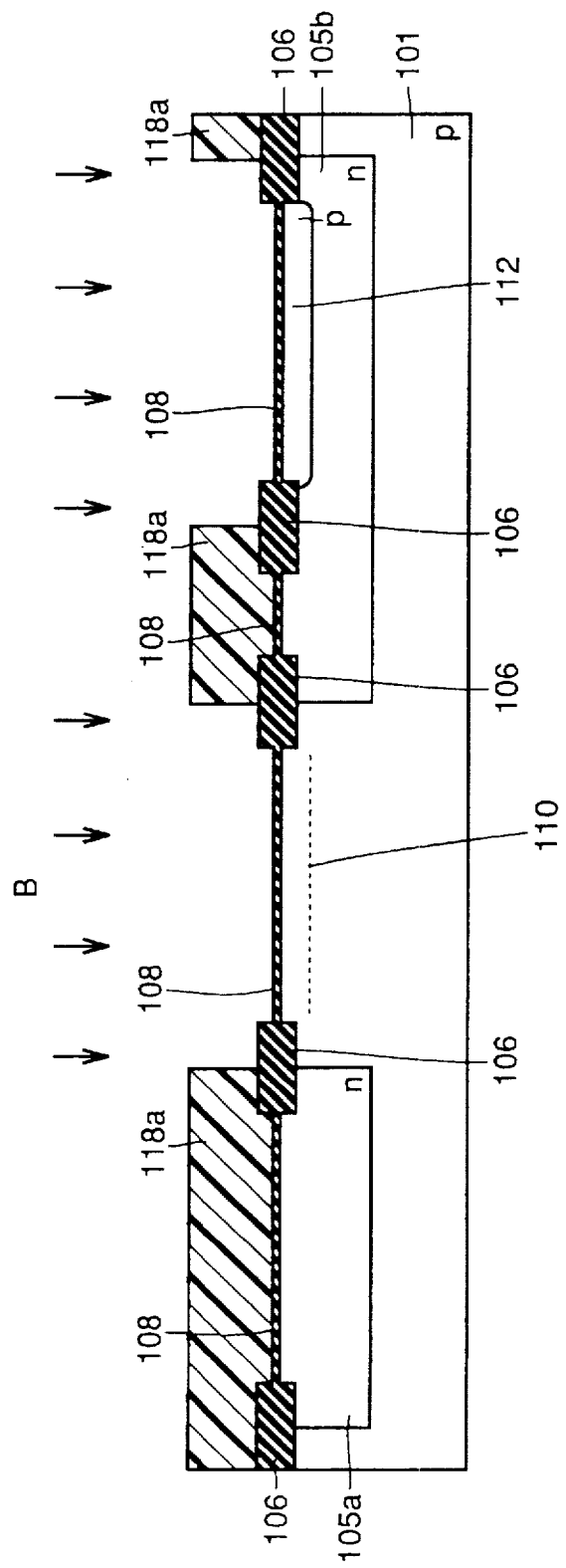
Figure 18:
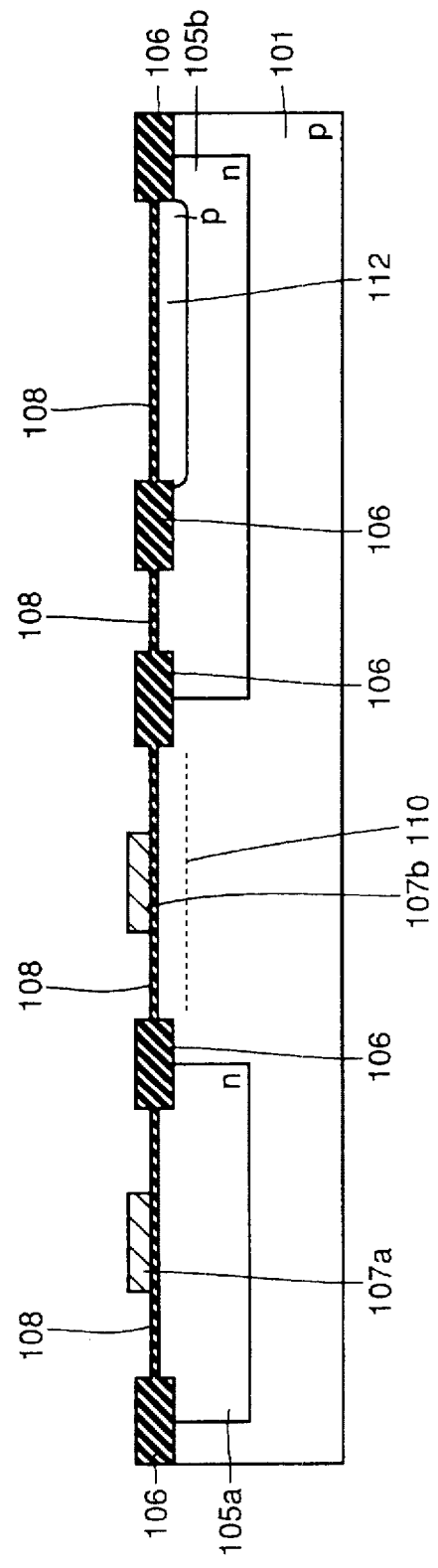
Figure 19:
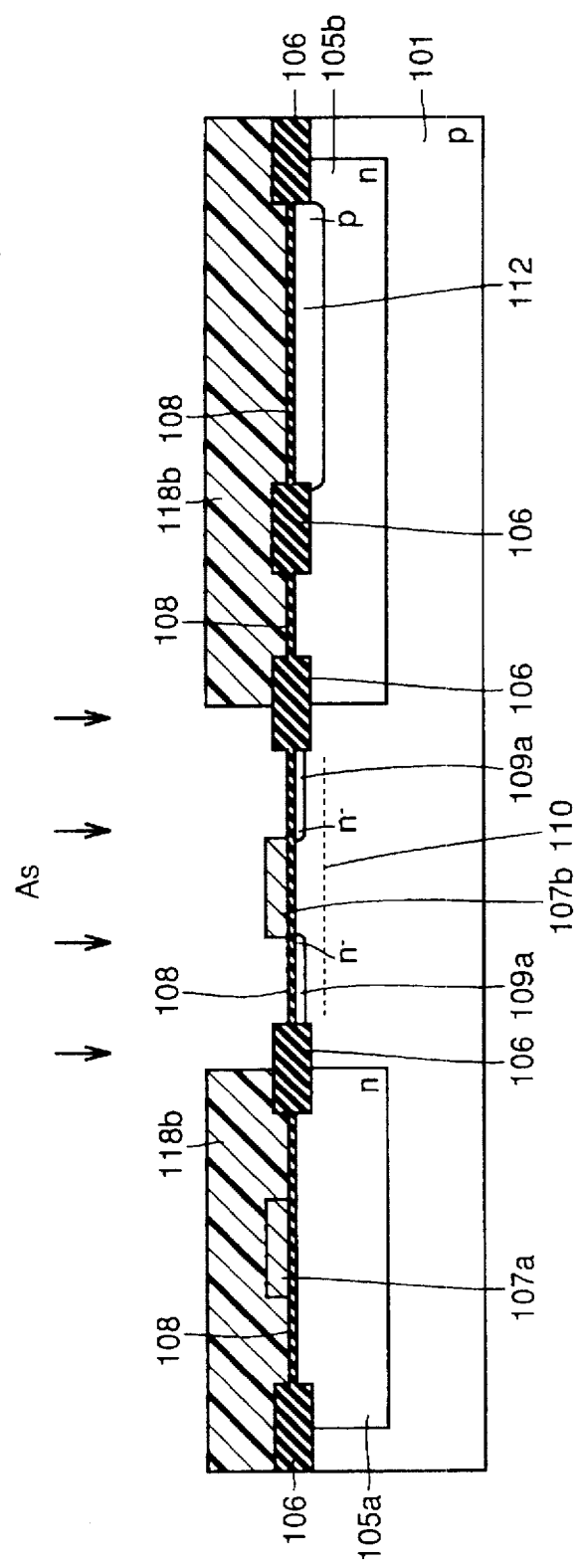
Figure 20:
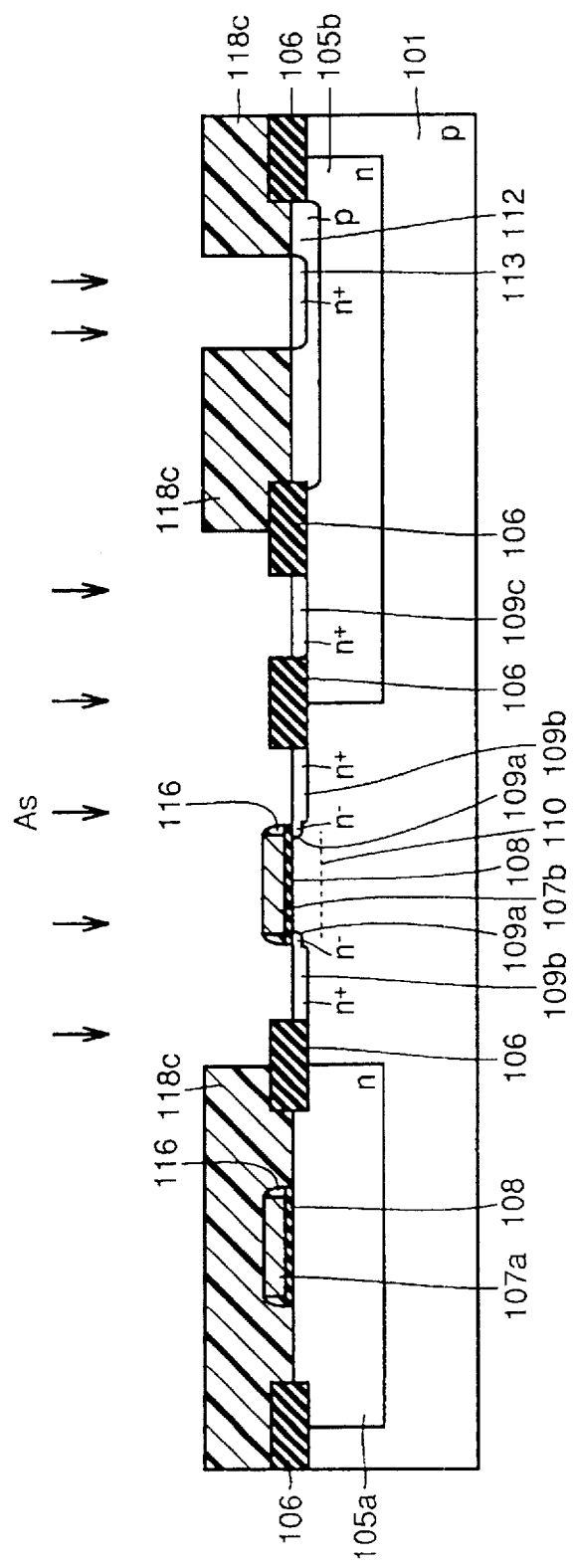
Figure 21:
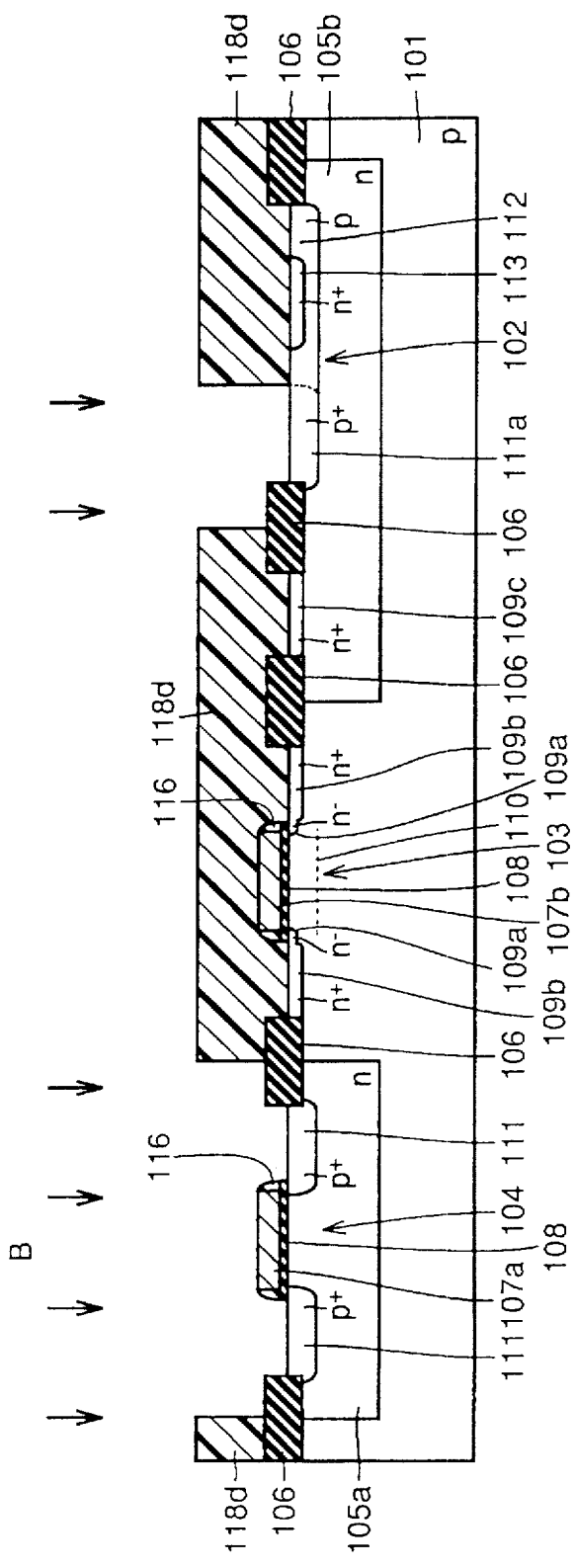
Figure 22:
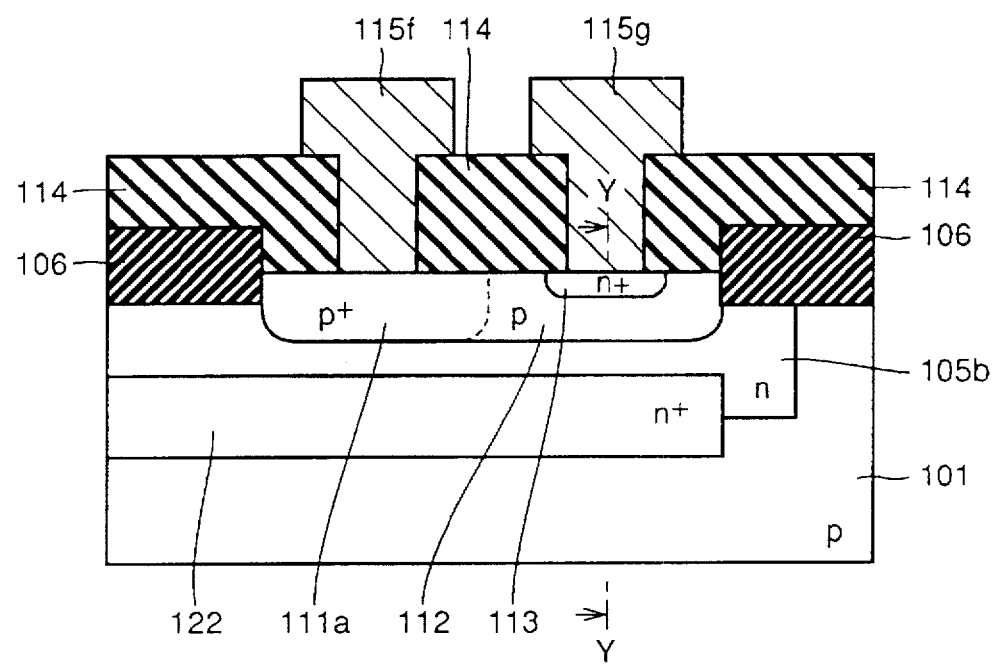
FIG. 22 is a fragmentary cross section showing a state that an $n^+$-buried layer is formed at a bipolar transistor in the BiCMOS shown in FIG. 15.
Figure 23:
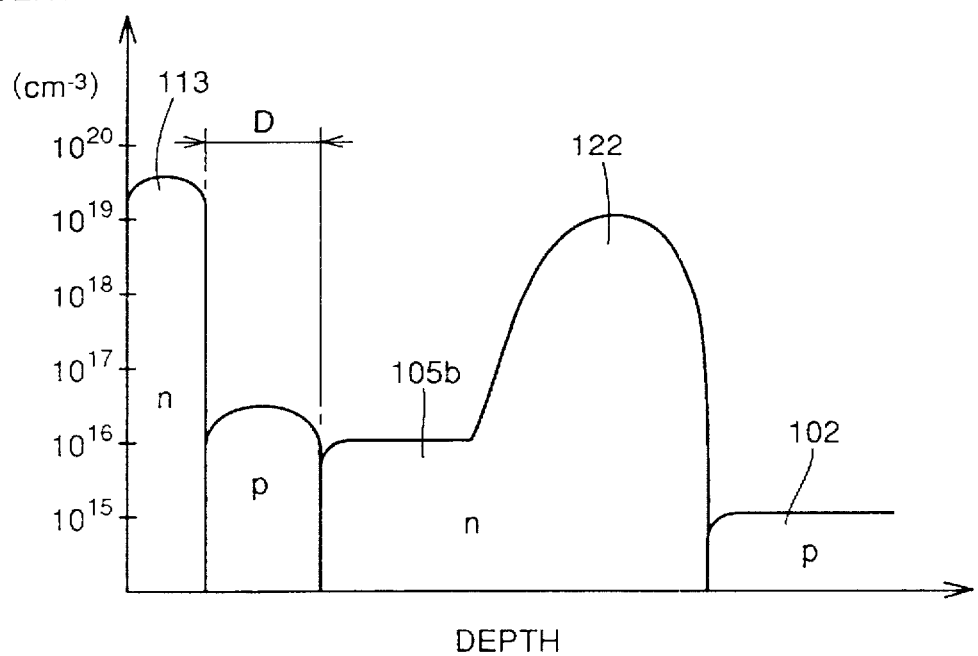
FIG. 23 shows concentration distribution taken along line Y—Y in FIG. 22.
Figure 24:
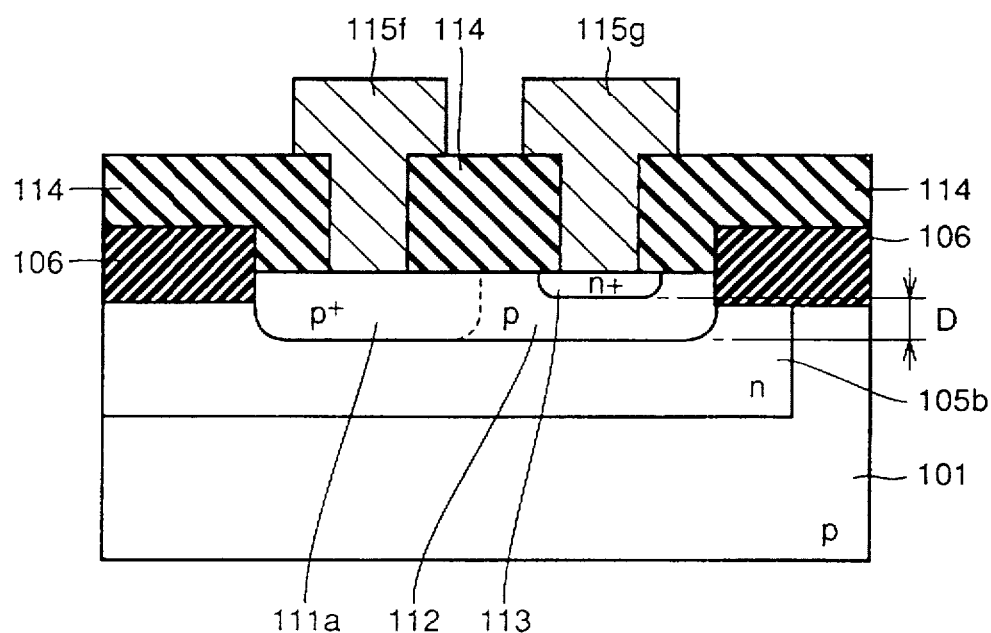
FIG. 24 is a fragmentary cross section showing, on an enlarged scale, the bipolar transistor in FIG. 15.

FIG. 1 is a cross section showing a BiCMOS of an embodiment of the invention. Referring to FIG. 1, the BICMOS according to the invention includes a base layer 12, a portion of which located immediately under an emitter layer 13 has a diffusion depth smaller than that in the prior art. A concentration of base layer 12 is higher than that of base layer 112 in the prior art. Structures other than the above are the same as those in the prior art shown in FIG. 15.

More specifically, an isolating oxide film 6 is selectively formed at element isolating regions in a main surface of a p-type semiconductor substrate 1. A bipolar transistor 2, an nMOS transistor 3 and a pMOS transistor 4 are formed at the element formation regions in the main surface of p-type semiconductor substrate 1. Bipolar transistor 2 has an n-type collector layer 5b as well as p-type base layer 12 and n-type emitter layer 13. An external base layer 11a is formed at a base electrode formation region. An $n^+$-diffusion layer 9c is formed at a collector electrode formation region.

nMOS transistor 3 has $n^-$-diffusion layers 9a, $n^+$-diffusion layers 9b and a gate electrode 7b. A gate oxide film 8 is formed on a channel region 10 of nMOS transistor 3.

pMOS transistor 4 has $p^+$-diffusion layers 11 and a gate electrode 7a. Gate electrode 7a is formed on a channel region of pMOS transistor 4 with gate oxide film 8 therebetween. Side wall insulating layers 16 made of, e.g., silicon oxide films are formed on side walls of gate electrodes 7a and 7b.

Bipolar transistor 2, nMOS transistor 3 and pMOS transistor 4 are covered with interlayer insulating film 14 formed on the main surface of p-type semiconductor substrate 1 and made of, e.g., a silicon oxide film. Interlayer insulating film 14 is provided at predetermined positions with contact holes. Metal interconnections 15a, 15b, 15c, 15d, 15e, 15f and 15g are formed in the contact holes. Metal interconnections 15a–15g are preferably made of material containing aluminum.

Figure 2:
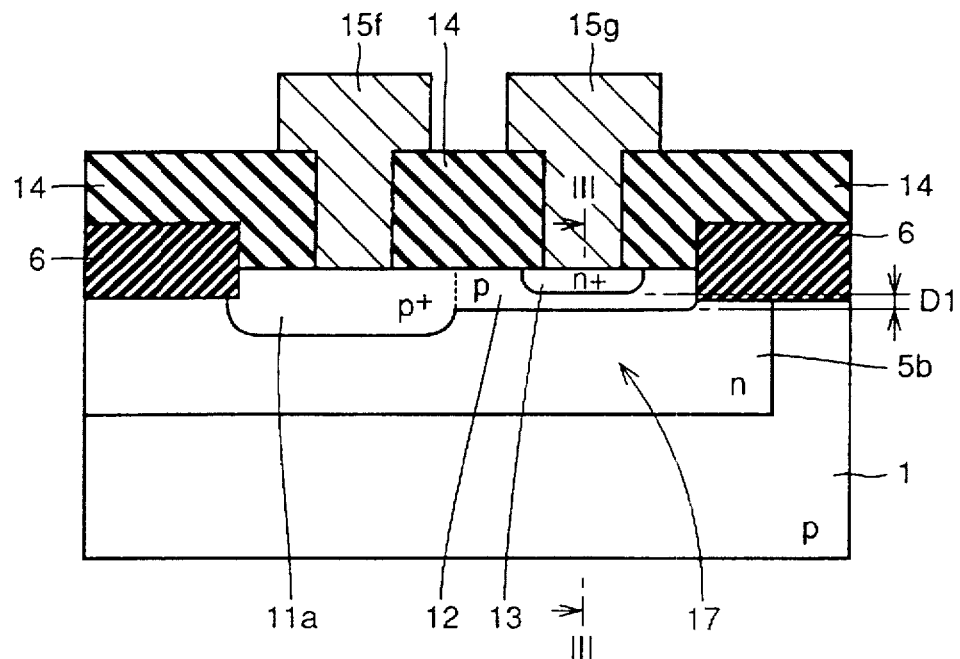
FIG. 2 is a fragmentary cross section showing, on an enlarged scale, a bipolar transistor in FIG. 1.

Referring to FIG. 2, distinctive features of the BiCMOS of this embodiment will be described below in greater detail. FIG. 2 is a fragmentary cross section showing, on an enlarged scale, the bipolar transistor shown in FIG. 1.

Referring to FIG. 2, a diffusion depth D1 of base layer 12 immediately under emitter layer 13 is smaller than the diffusion depth D of base layer 112 in the prior art. More specifically, the diffusion depth D1 is not more than 0.3 μm. More preferably, the diffusion depth D1 is in a range from 0.25 μm to 0.18 μm. Thereby, the operation speed of the bipolar transistor can be increased.

Figure 3:
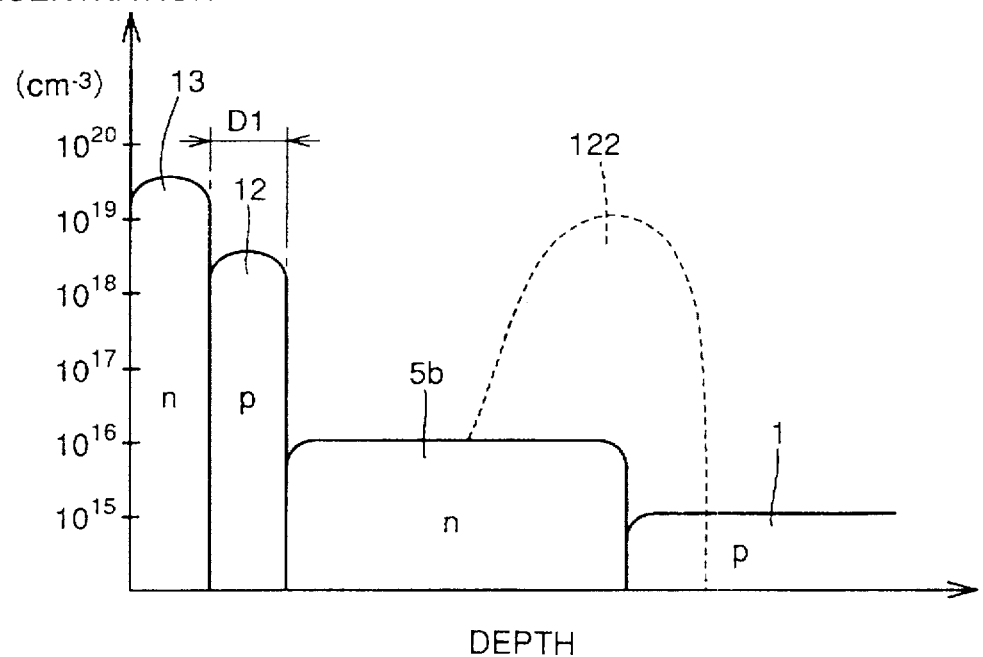
FIG. 3 shows concentration distribution taken along line III—III in FIG. 2.

FIG. 3 shows concentration distribution taken along line III—III in FIG. 2. The concentration of base layer 12 is preferably about $10^{18}$ cm$^{-3}$, and the concentration of collector layer 5b is preferably in a range from about $10^{16}$ to about $10^{17}$ cm$^{-3}$. The bipolar transistor having the collector layer 5b of such concentration distribution is liable to be saturated because its collector resistance is high as already stated. However, the manufacturing cost can be small because n$^+$-buried layer 122 described in connection with the prior art is not formed. The bipolar transistor having a high collector resistance described above can be used in a circuit performing small amplitude operation. More specifically, the bipolar transistor of this embodiment can be used in a differential circuit in a sense amplifier of an SRAM (Static Random Access Memory).

Figure 12:
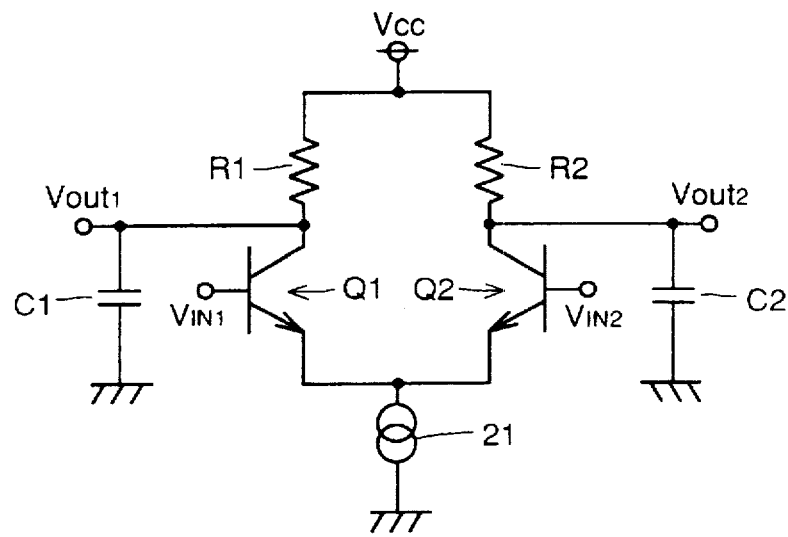
FIG. 12 is an equivalent circuit diagram showing an example of a differential circuit.

Here, structure and operation of the differential circuit will be described below with reference to FIG. 12. FIG. 12 is an equivalent circuit diagram showing an example of the differential circuit. Referring to FIG. 12, a pair of npn transistors Q1 and Q2 are connected to have a common emitter. The emitter is connected to a constant current circuit (0.5 mA) 21. Collectors of npn bipolar transistors Q1 and Q2 are connected to a power supply Vcc via resistances R1 and R2 (R1=R2=600Ω), respectively. A base of npn bipolar transistor Q1 is connected to an input terminal Vin1. A base of npn bipolar transistor Q2 is connected to an input terminal Vin2. The collectors of npn bipolar transistors Q1 and Q2 are also connected to output terminals Vout1 and Vout2, respectively. Output terminals Vout1 and Vout2 are grounded through capacitors C1 and C2 (C1=C2=0.5 pF), respectively.

If a voltage applied to input terminal Vin1 is higher than that applied to input terminal Vin2, a current flows through bipolar transistor Q1. Thereby, output terminal Vout 1 is brought to a potential lower than that of output terminal Vout 2. If the voltage applied to input terminal Vin1 is lower than that applied to input terminal Vin2, output terminal Vout 1 is brought to a potential higher than that of output terminal Vout 2.

Figure 13:
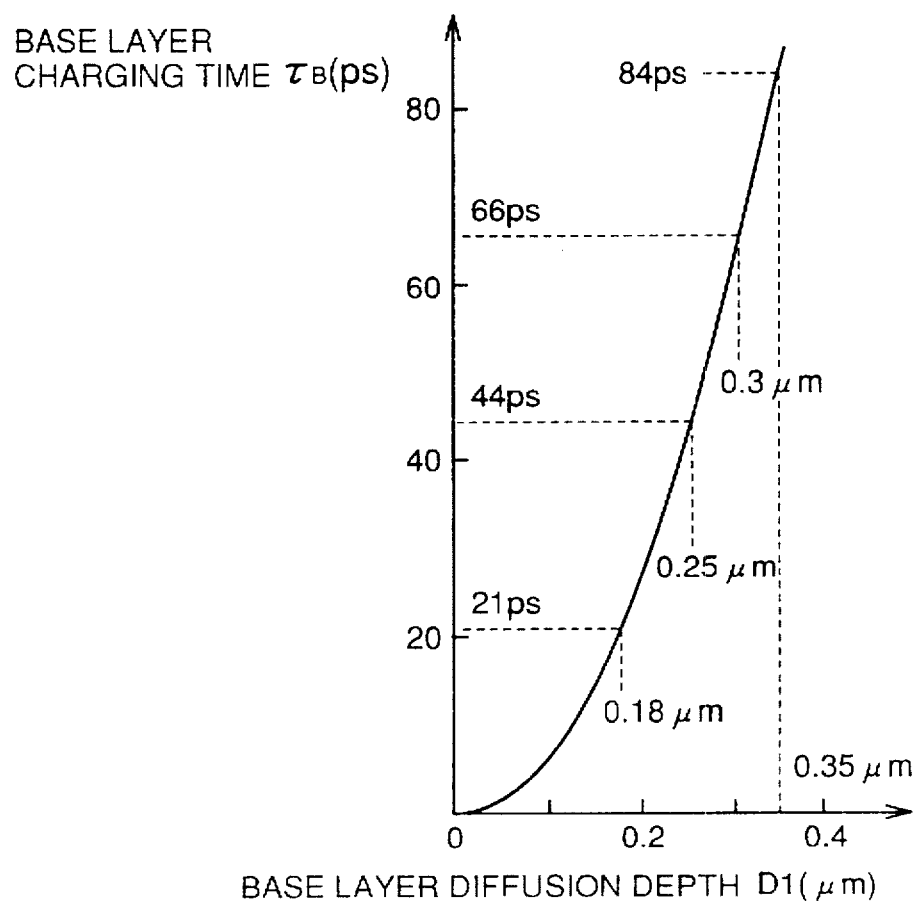
FIG. 13 shows relationship between a base layer charging time $\tau_B$ and a base layer diffusion depth D1.
Figure 14:
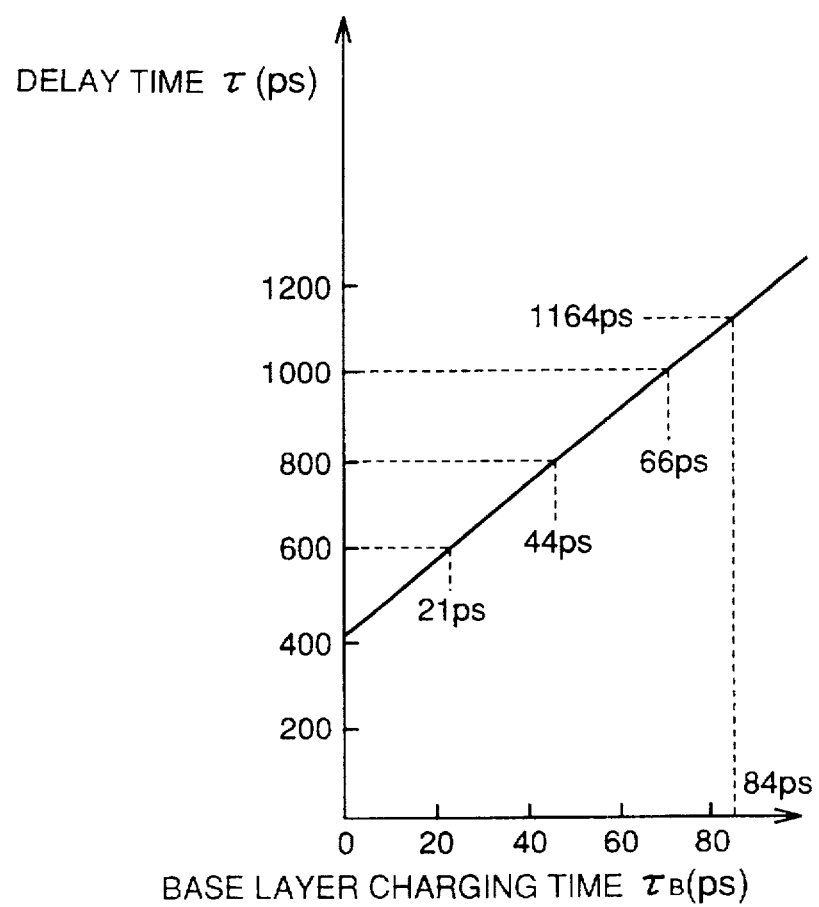
FIG. 14 shows a relationship between a delay time $\tau$ and a base layer charging time $\tau_B$.

Referring to FIGS. 13 and 14, description will be given on dependency of a delay time τ of the above differential circuit on the base layer charging time $\tau_B$ and dependency of the base layer charging time $\tau_B$ on the base layer diffusion depth D1. FIG. 13 shows a relationship between the base layer charging time $\tau_B$ and the base layer diffusion depth D1. FIG. 14 shows a relationship between the delay time τ and the base layer charging time $\tau_B$.

Referring to FIG. 13, base layer charging time $\tau_B$ is 84 ps, e.g., in the prior art which includes base layer 112 having diffusion depth D1 of 0.35 µm. In this case, delay time τ goes to a considerably large value of 1164 ps as shown in FIG. 14. Meanwhile, if base layer depth D1 is set to a small value of, e.g., 0.3 µm, delay time τ is reduced to 1000 ps.

Delay time τ of the differential circuit shown in FIG. 12 is preferably not more than 1000 ps in order to obtain a merit by using an npn-type bipolar transistor in a sense amplifier of an SRAM in connection with an MOS transistor having a minimum gate length not more than 0.8 µm. The reason for this is that a delay time of a differential circuit is 1000 ps in a 256K-SRAM having an MOS transistor of which minimum gate length is 0.8 µm. This is achieved by setting the base layer diffusion depth D1 to a value not more than 0.3 µm. More preferably, the delay time τ is in a range from 800 to 600 ps or less. This is achieved by setting diffusion depth D1 of base layer 12 to a value ranging from 0.25 to 0.18 µm or less.

Then, referring to FIGS. 4 to 9, a method of manufacturing the BiCMOS of this embodiment will be described below. FIGS. 4 to 9 are cross sections showing 1st to 6th steps in a process of manufacturing the BiCMOS of the embodiment, respectively.

Figure 4:
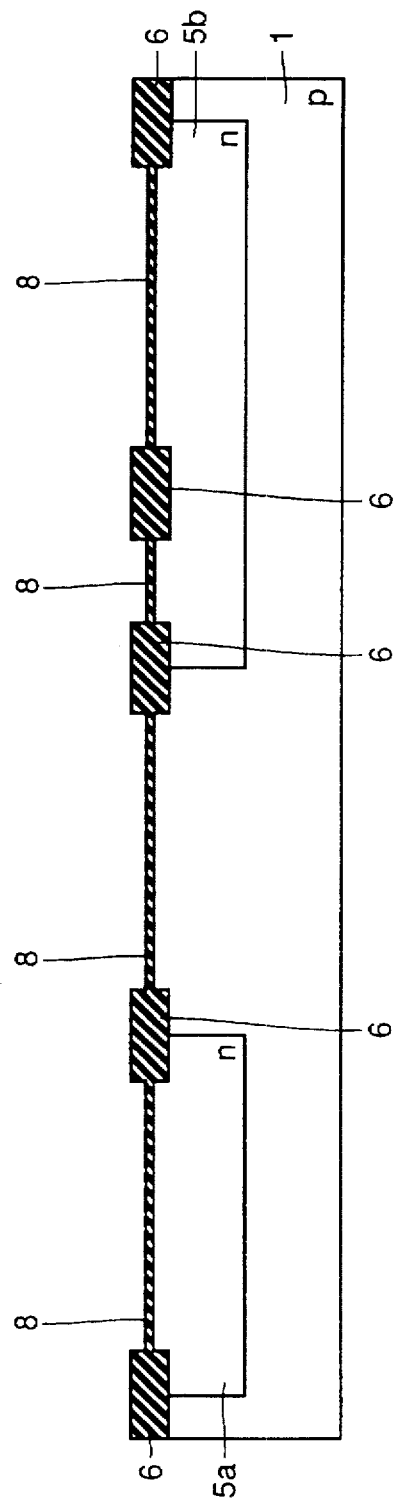
FIGS. 4–9 are cross sections showing 1st to 6th steps in a process of manufacturing the BiCMOS shown in FIG. 1, respectively.

Referring first to FIG. 4, n-well region 5a, n-type collector layer 5b, isolating oxide film 6 and gate oxide film 8 are formed at the main surface of p-type semiconductor substrate 1 by a method similar to the conventional method. In connection with this, n-well region 5a and collector layer 5b are formed simultaneously for simplifying the process. pMOS transistor will be formed at n-well region 5a in a later step. Therefore, the concentration of n-well region 5a cannot be increases significantly, because significantly increased concentration would cause difficulty of forming p$^+$-diffusion layers of a concentration from $5\times10^{19}$ to $5\times10^{20}$ cm$^{-3}$ for the source/drain regions of pMOS transistor. Therefore, the concentration of n-well region 5a and collector layer 5b must be not more than $5\times10^{18}$ cm$^{-3}$. Preferably, the concentration of n-type impurity contained in these regions is not more than $10^{18}$ cm$^{-3}$. Therefore, the concentration of p$^+$-diffusion layer is not less than a value ten times as large as the concentration of n-well region 5a, so that the concentration of p$^+$-diffusion layer is not affected by n-well region 5a.

Figure 5:
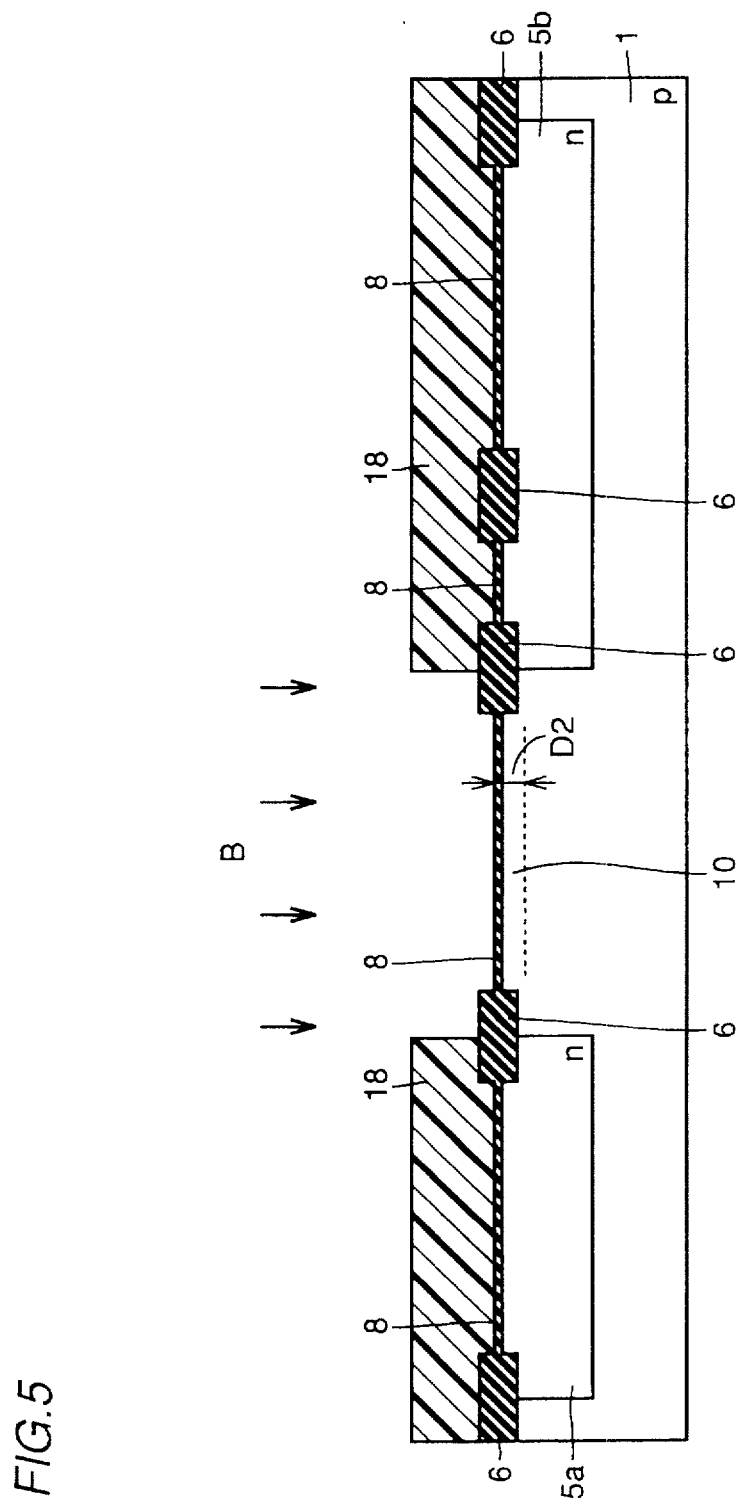

Referring now to FIG. 5, a resist pattern 18 exposing an nMOS transistor formation region is formed on the main surface of p-type semiconductor substrate 1. Using this resist pattern 18 as a mask, p-type impurity such as boron (B) is implanted into the main surface of p-type semiconductor substrate 1. This implantation is performed under the conditions of about 50 keV and about $6\times10^{12}$ cm$^{-2}$. This forms channel region 10 having a concentration of about $10^{16}$ cm$^{-3}$ and a diffusion depth D2.

Figure 6:
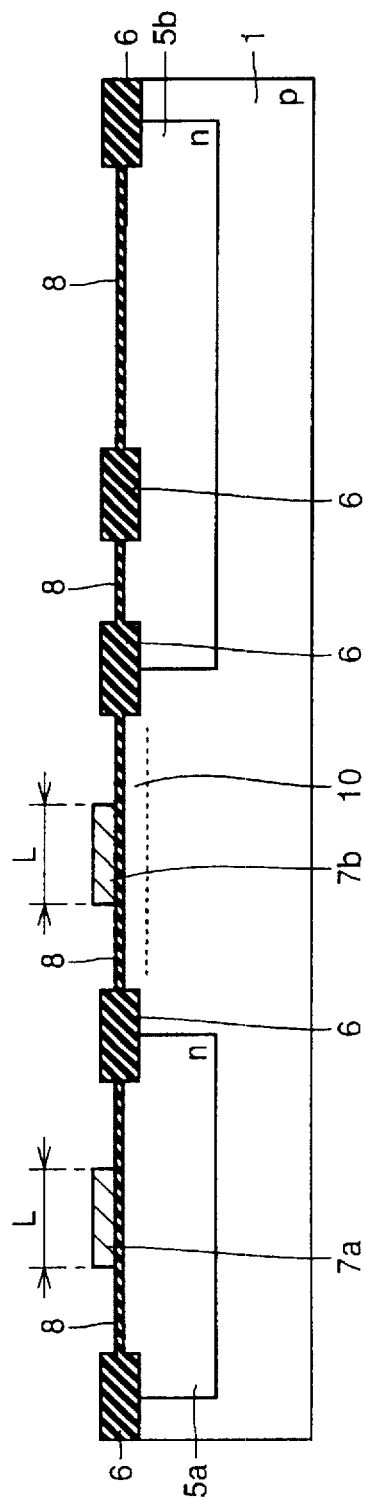

Referring to FIG. 6, after removing resist pattern 18, the CVD method is used to form a polycrystalline silicon layer on the whole surface of p-type semiconductor substrate 1. This polycrystalline silicon layer is patterned to form gate electrodes 7a and 7b. A minimum gate length L of gate electrodes 7a and 7b is preferably not more than 0.8 µm.

Figure 7:
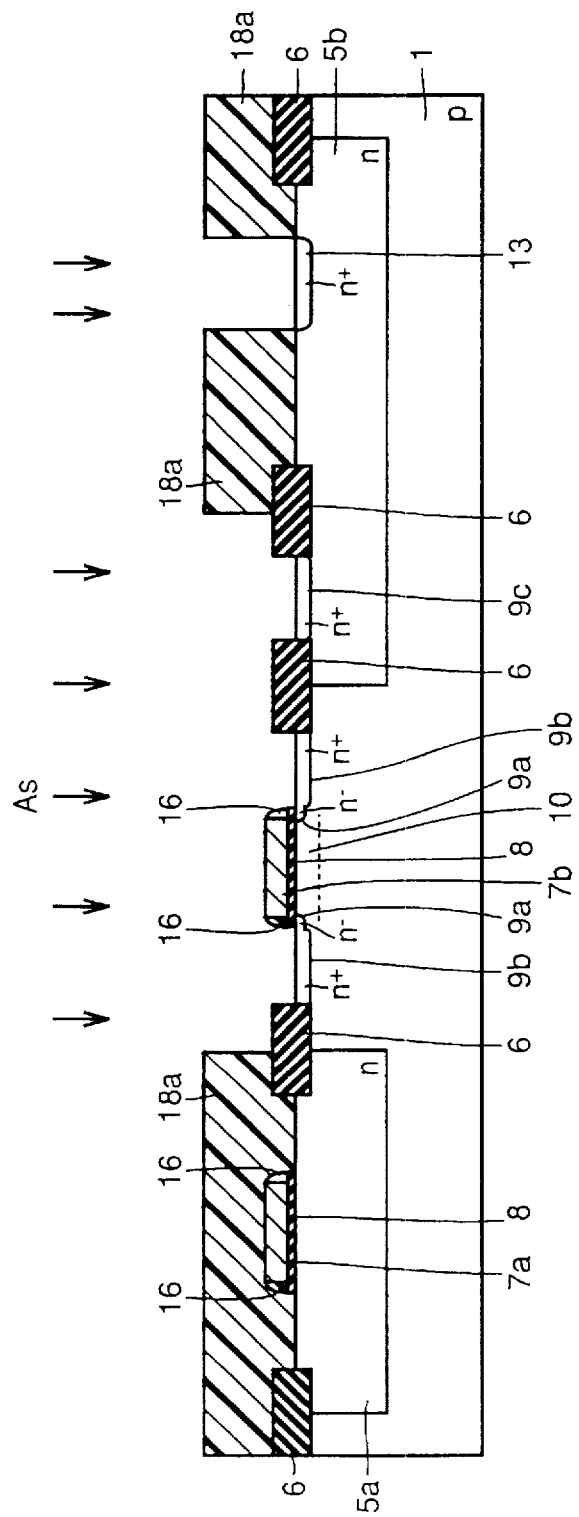

Referring to FIG. 7, after forming n$^-$-diffusion layers 9a, side wall insulating layers 16 made of, e.g., silicon oxide film are formed on the side walls of gate electrodes 7a and 7b by a method similar to the conventional method. Then, one forms a resist pattern 18a exposing an nMOS transistor formation region, a collector electrode formation region and an emitter layer formation region. Using this resist pattern 18a as a mask, n-type impurity such as arsenic (As) is implanted into the main surface of p-type semiconductor substrate 1. This implantation is performed under the conditions of about 20 keV and from about $10^{15}$ to about $10^{16}$ cm$^{-2}$. This simultaneously forms n$^+$-diffusion layers 9b forming the source/drain regions of nMOS transistor, n$^+$-diffusion layer 9c at the collector electrode formation region and emitter layer 13. The concentration of these regions is preferably not less than about $10^{19}$ cm$^{-3}$.

Figure 8:
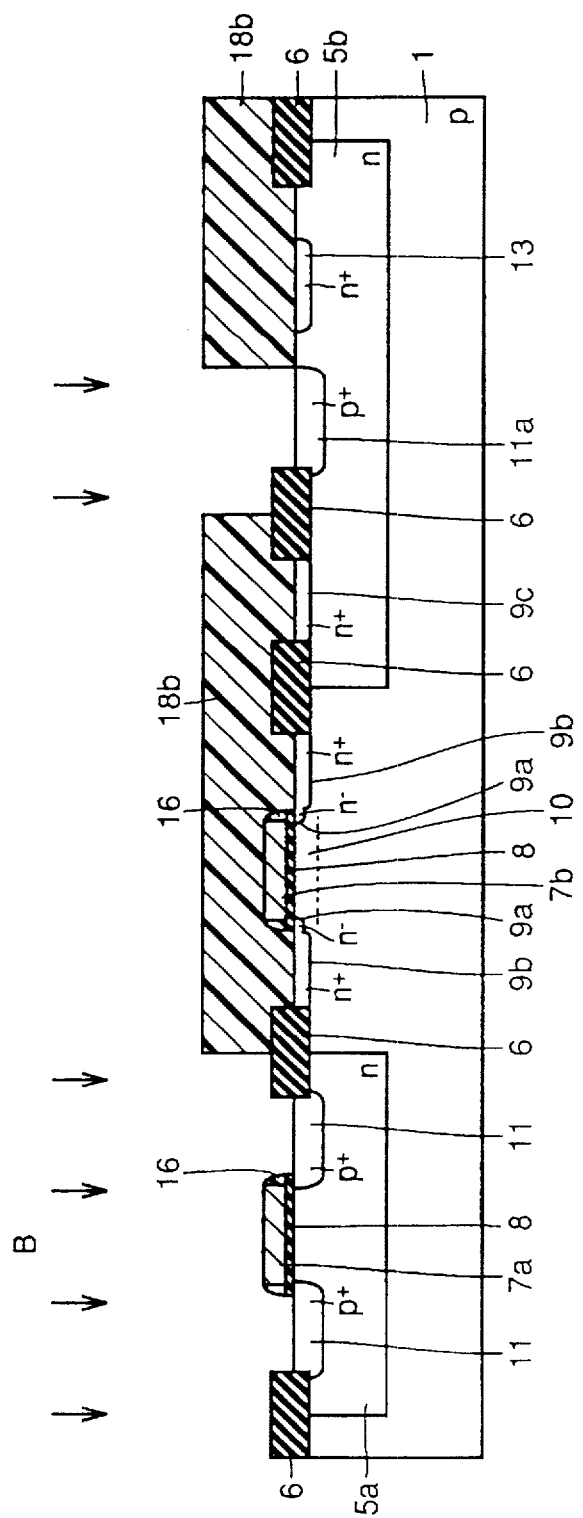

Referring now to FIG. 8, one forms a resist pattern 18b exposing a PMOS transistor formation region and a portion of the surface of collector layer 5b. Using this resist pattern 18b as a mask, p-type impurity such as boron (B) is implanted into the main surface of p-type semiconductor substrate 1. This simultaneously forms p$^+$-diffusion layers 11 forming the source/drain regions of pMOS transistor as well as external base layer 11a at a region for forming the base electrode.

Figure 9:
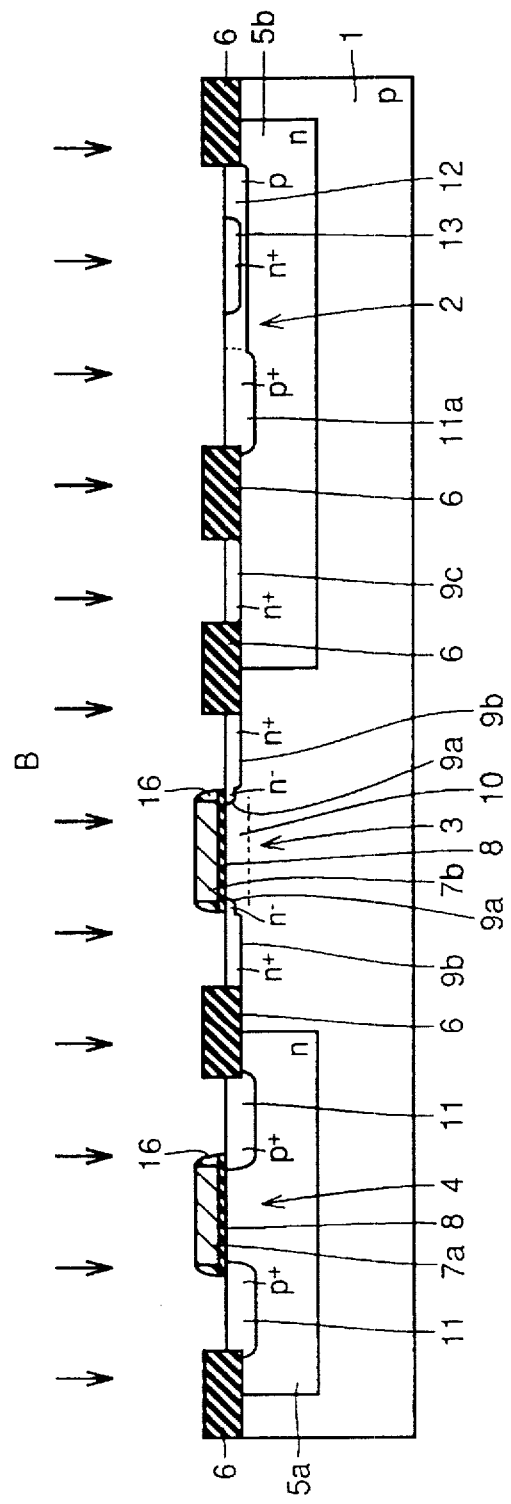

Referring to FIG. 9, p-type impurity such as boron (B) or BF$_2$ is implanted into the whole surface of p-type semiconductor substrate 1. This implantation is performed under the conditions of about 15 kev and about $2\times10^{14}$ cm$^{-2}$. This forms base layer 12 at a concentration of about $10^{18}$ cm$^{-3}$. At this step, the above p-type impurity for forming base layer 12 is also introduced into n$^+$-diffusion layers 9b forming the source/drain regions of nMOS transistor. However, the concentration of n$^+$-diffusion layer 9b is nearly ten times as large as the concentration of base layer 12, so that no problem is cause in connection with the performance of the nMOS transistor. Although the manufacturing process additionally requires one step for forming base layer 12, the impurity for this is implanted into the whole main surface of semiconductor substrate 1 without forming a mask such as a resist pattern, so that the manufacturing cost does not increase significantly.

As described above, the energy for implantation of p-type impurity for forming base layer 12 can be smaller than that in the prior art, so that the diffusion depth of base layer 12 can be small. Since base layer 12 is formed after formation of gate electrodes 7a and 7b, formation of side wall insulating layers 16 and formation of n$^+$-diffusion layers 9b, heat treatment required for them is not effected on base layer 12. Therefore, the diffusion depth of base layer 12 can be small.

More specifically, if base layer 12 is formed under the above conditions and the heat treatment is subsequently performed at 850° C. for 20 minutes, base layer 12 has diffusion depth D1 of 0.15 µm. In this case, as shown in FIGS. 13 and 14, delay time τ is 550 ps. Thus, the device can operate at a remarkably high speed as compared with the prior art.

Since base layer 12 is formed at a dedicated step independent from the other steps, the bipolar transistor can be miniaturized to a higher extent (i.e., diffusion depth D1 of base layer 12 can be reduced) correspondingly to miniaturization of the MOS transistor.

After forming base layer 12 as described above, a method similar to the prior art is performed to form interlayer insulating film 14 and metal interconnections 15a-15g. Through the steps described above, the BiCMOS shown in FIG. 1 is completed.

Figure 10:
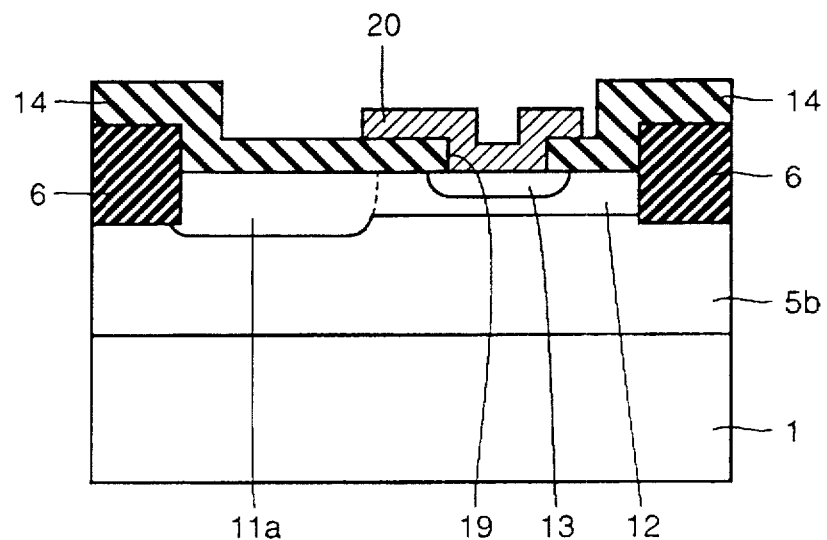
FIG. 10 is a cross section showing a first modification of a structure of a bipolar transistor.
Figure 11:
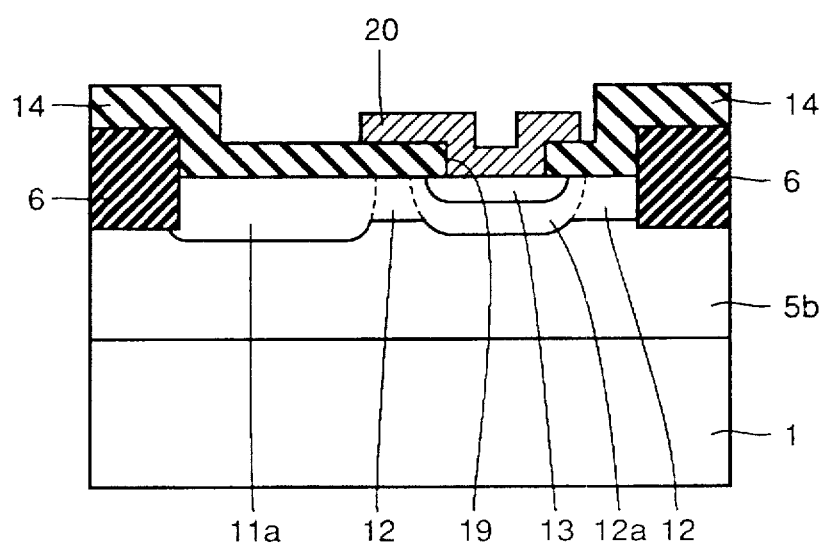
FIG. 11 is a cross section showing a second modification of a structure of a bipolar transistor.

Then, referring to FIGS. 10 and 11, a modification of the structure of the bipolar transistor will be described below. FIG. 10 is a cross section of a first modification of the bipolar transistor. FIG. 11 is a cross section showing a second modification of the bipolar transistor.

In the foregoing embodiment, emitter electrode 15g is made of only metal. As shown in FIG. 10, however, emitter electrode 20 may be made of polycrystalline silicon or a two-layer structure made of WSi and polycrystalline silicon. In this case, emitter electrode 20 may be formed simultaneously with interconnection layers in the memory cell of SRAM, whereby the manufacturing steps do not increase in number. Also in this case, emitter layer 13 may be formed by implanting impurity of n-type such as arsenic (As) into the surface of base layer 12 after forming contact holes 19, which are used for forming emitter electrode 20, at interlayer insulating layer 14. Also emitter layer 13 may be formed in such a manner that n-type impurity, which has been introduced into polycrystalline silicon layer 20 during formation of polycrystalline silicon layer 20, is diffused into the main surface of p-type semiconductor substrate 1.

Referring to FIG. 11, a true base layer 12a may be formed after forming interlayer insulating layer 14. This can be formed in such a manner that, in connection with the step for forming polycrystalline silicon layer forming the emitter electrode, contact hole 19 is formed at interlayer insulating layer 14, and then impurity of p-type is implanted into the main surface of p-type semiconductor substrate 1 through contact hole 19. Thereby, heat treatment required for forming interlayer insulating layer 14 is not effected on true base layer 12a. Therefore, the diffusion depth of base layer 12a can be further reduced as compared with the foregoing embodiment. In this structure, base layer 12 surrounding true base layer 12a functions as a link base layer connecting true base layer 12a and external base layer 11a.

n-well region 5a and collector layer 5b may be formed by thermal diffusion of phosphorus (P). n-well region 5a and collector layer 5b may have a retrograde well structure formed with high energy implantation. Further, p-well region may be formed at the nMOS transistor formation region. In this case, the p-well region may be a well formed by thermal diffusion of boron (B) or a retrograde well formed with high energy implantation or the like.

In the foregoing embodiment, gate electrodes 7a and 7b each are formed of a single layer of polycrystalline silicon. However, they may have a two-layer structure, e.g., made of WSi and polycrystalline silicon. Gate oxide film 8, which is formed before formation of the channel region of nMOS transistor in the foregoing embodiment, may be formed after formation of the channel region. Thereby, it is possible to prevent contamination of gate oxide film 8 by the resist and others. Further, nMOS transistor may have a single drain structure.

Furthermore, pMOS transistor may have the LDD structure. In this case, it is possible to utilize the step of forming the p$^-$-diffusion layer as the step of forming base layer 12. Thereby, it is not necessary to implant boron (B) into the whole surface, as is done in the foregoing embodiment. As a result, p-type impurity (boron) used for forming base layer 12 is not implanted into the source/drain regions of nMOS transistor. Further, the semiconductor device having the bipolar transistor according to the invention can be applied to SRAMs having memory cells of a high resistance load type and SRAMs having memory cells of a TFT load type. Metal interconnections 15a-15g may have an interconnection structure including two or more layers.

In the semiconductor device having the bipolar transistor according to the invention, as described hereinbefore, the diffusion depth of base layer can be restricted within a range not exceeding 0.3 µm even if the collector concentration is small and not more than $5\times10^{18}$ cm$^{-3}$, so that the invention can provide the semiconductor device having the bipolar transistor which can be used in a circuit performing small amplitude operation and can operate at a sufficiently high speed.

In the method of manufacturing the semiconductor device having the bipolar transistor according to the invention, it is possible to form the base layer after forming the MOS transistor. Therefore, heat treatment required for formation of the MOS transistor is not effected on the base layer. Thereby, the diffusion depth of the base layer can be restricted to a small value. In contrast to the prior art, the channel region of the MOS transistor is formed at the step independent from that of forming the base layer. Therefore, it is possible to restrict the implantation energy of impurity for forming the base layer to a small value. Owing to the above, the invention can provide the semiconductor device having the bipolar transistor in which the diffusion depth of the base layer is restricted to a small value. Thus, the invention can provide the semiconductor device having the bipolar transistor which can operate at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar transistor comprising:

a semiconductor substrate of a first conductivity type having a main surface;

a collector layer of a second conductivity type formed at the main surface of said semiconductor substrate;

a base layer of the first conductivity type formed at the surface of said collector layer; and an emitter layer of the second conductivity type formed at the surface of said base layer, wherein a concentration of an impurity of the second conductivity type contained in said collector layer between said base layer and the substrate in the depth direction of the substrate is not more than $5 \times 10^{18}$ cm$^{-3}$, and said base layer located immediately under said emitter layer has a diffusion depth not more than 0.3 µm.

2. The bipolar transistor according to claim 1, wherein said bipolar transistor is formed in a sense amplifier.

3. A semiconductor device having a bipolar transistor comprising:

a semiconductor substrate of a first conductivity type having a main surface;

a collector layer of a second conductivity type formed at a first region in said main surface of said semiconductor substrate;

a base layer of the first conductivity type formed at the surface of said collector layer; and an emitter layer of the second conductivity type formed at the surface of said base layer; and an MOS transistor formed at a second region in said main surface of said semiconductor substrate, wherein said MOS transistor has a minimum gate length not more than 0.8 µm, a concentration of an impurity of the second conductivity type contained in said collector layer between said base layer and the substrate in the depth direction of the substrate is not more than $5 \times 10^{18}$ cm$^{-3}$, and said base layer located immediately under said emitter layer has a diffusion depth not more than 0.3 µm.

4. The semiconductor device having the bipolar transistor according to claim 3, wherein said semiconductor device has a sense amplifier, said MOS transistor is an n-channel MOS transistor, and the bipolar transistor formed of said collector layer, said base layer and said emitter layer is an npn-type bipolar transistor, and said bipolar transistor is formed in said sense amplifier.

5. The semiconductor device having the bipolar transistor according to claim 4, wherein a concentration of p-type impurity contained in said base layer is different from a concentration of p-type impurity contained in a channel region of said n-channel MOS transistor.

6. The semiconductor device having the bipolar transistor according to claim 5, wherein a concentration of p-type impurity contained in said base layer is about $1 \times 10^{18}$ cm$^{-3}$, and a concentration of p-type impurity contained in said channel region is about $1 \times 10^{16}$ cm$^{-3}$.

7. The semiconductor device having the bipolar transistor according to claim 3, wherein said semiconductor device having said bipolar transistor is an SRAM (Static Random Access Memory).

8. The semiconductor device having the bipolar transistor according to claim 3, wherein said semiconductor device is arranged in a circuit performing small amplitude operation in a range from about ±50 mV to about ±150 mV.

9. The semiconductor device having the bipolar transistor according to claim 3, wherein said semiconductor device is arranged in a differential circuit.

10. The bipolar transistor according to claim 1, wherein the diffusion depth is at least about 0.015 µm.

11. The semiconductor device according to claim 3, wherein the diffusion depth is at least about 0.015 µm.

12. The bipolar transistor according to claim 10, wherein the diffusion depth ranges from about 0.15 µm to not greater than about 0.3 µm.

13. The bipolar transmission according to claim 11, wherein the diffusion depth ranges from about 0.15 µm to not greater than about 0.3 µm.

* * * * *